(12) United States Patent
Sakata et al.

(10) Patent No.: US 8,497,624 B2
(45) Date of Patent: Jul. 30, 2013

(54) LI-CONTAINING α-SIALON-BASED PHOSPHOR PARTICLE, PRODUCTION METHOD THEREOF, LIGHTING DEVICE, AND IMAGE DISPLAY DEVICE

(75) Inventors: Shin-ichi Sakata, Ube (JP); Hiroshi Oda, Ube (JP); Hiroshi Fujino, Ube (JP)

(73) Assignee: Ube Industries, Ltd. (JP)

( * ) Notice: Subject to any disclaimer, the term of this patent is extended or adjusted under 35 U.S.C. 154(b) by 0 days.

(21) Appl. No.: 13/581,529

(22) PCT Filed: Mar. 1, 2011

(86) PCT No.: PCT/JP2011/055176
§ 371 (c)(1),
(2), (4) Date: Aug. 28, 2012

(87) PCT Pub. No.: WO2011/108740
PCT Pub. Date: Sep. 9, 2011

(65) Prior Publication Data
US 2012/0319566 A1    Dec. 20, 2012

(30) Foreign Application Priority Data
Mar. 1, 2010    (JP) ................ 2010-044524

(51) Int. Cl.
*C09K 11/80* (2006.01)
*H01J 1/63* (2006.01)
*H05B 33/14* (2006.01)

(52) U.S. Cl.
USPC ............ 313/503; 313/500; 313/512; 445/12; 252/301.4 R

(58) Field of Classification Search
CPC ...... C09K 11/80; H01L 33/502; H01L 33/483; H05B 33/14; H05B 33/12
USPC ...... 313/500–512; 445/24–25; 252/301.4 F, 252/301.4 R
See application file for complete search history.

(56) References Cited

U.S. PATENT DOCUMENTS 7,144,524 B2 * 12/2006 Sakata et al. ............ 252/301.4 F
7,258,818 B2 *  8/2007 Sakata et al. ............ 252/301.4 F
(Continued)

FOREIGN PATENT DOCUMENTS

EP    1 264 873 A2   12/2002
JP    2002-363554 A  12/2002
(Continued)

OTHER PUBLICATIONS

Rong-Jun Xie et al., "Optical Properties of $Eu^{2+}$ in α-SiAlON," J. Phys. Chem. B 2004, 108, pp. 12027-12031.

*Primary Examiner* — Tracie Y Green
(74) *Attorney, Agent, or Firm* — DLA Piper LLP (US)

(57) ABSTRACT

An Li-containing α-sialon phosphor particle by mixing a silicon nitride or nitrogen-containing silicon compound powder, an AlN-containing aluminum source, an Li source and an Eu source, firing the mixture at 1,500 to 1,800° C. in a nitrogen-containing inert gas atmosphere under atmospheric pressure to obtain a lithium-containing α-sialon powder working out to a starting material, adding and mixing an additional lithium source to the powder, and re-firing the obtained mixture at a temperature lower than the above firing temperature or at a temperature of 1,100° C. to less than 1,600° C., at 1,100° C. to less than 1,600° C., in a nitrogen-containing inert gas atmosphere under atmospheric pressure.

16 Claims, 3 Drawing Sheets

10 μm

U.S. PATENT DOCUMENTS

| | | | |
|---|---|---|---|
| 7,858,997 B2 * | 12/2010 | Yoshimura et al. | 257/98 |
| 7,906,040 B2 * | 3/2011 | Mitomo et al. | 252/301.4 F |
| 7,910,023 B2 * | 3/2011 | Xie et al. | 252/301.4 F |
| 8,277,686 B2 * | 10/2012 | Sakata et al. | 252/301.4 F |
| 8,350,463 B2 * | 1/2013 | Pohl et al. | 313/503 |
| 2003/0030038 A1 | 2/2003 | Mitomo et al. | |
| 2013/0020533 A1 * | 1/2013 | Fujinaga et al. | 252/301.4 F |

FOREIGN PATENT DOCUMENTS

| | | |
|---|---|---|
| JP | 2004-067837 A | 3/2004 |
| WO | 2007/004493 A1 | 1/2007 |
| WO | 2010/018873 A1 | 2/2010 |

* cited by examiner

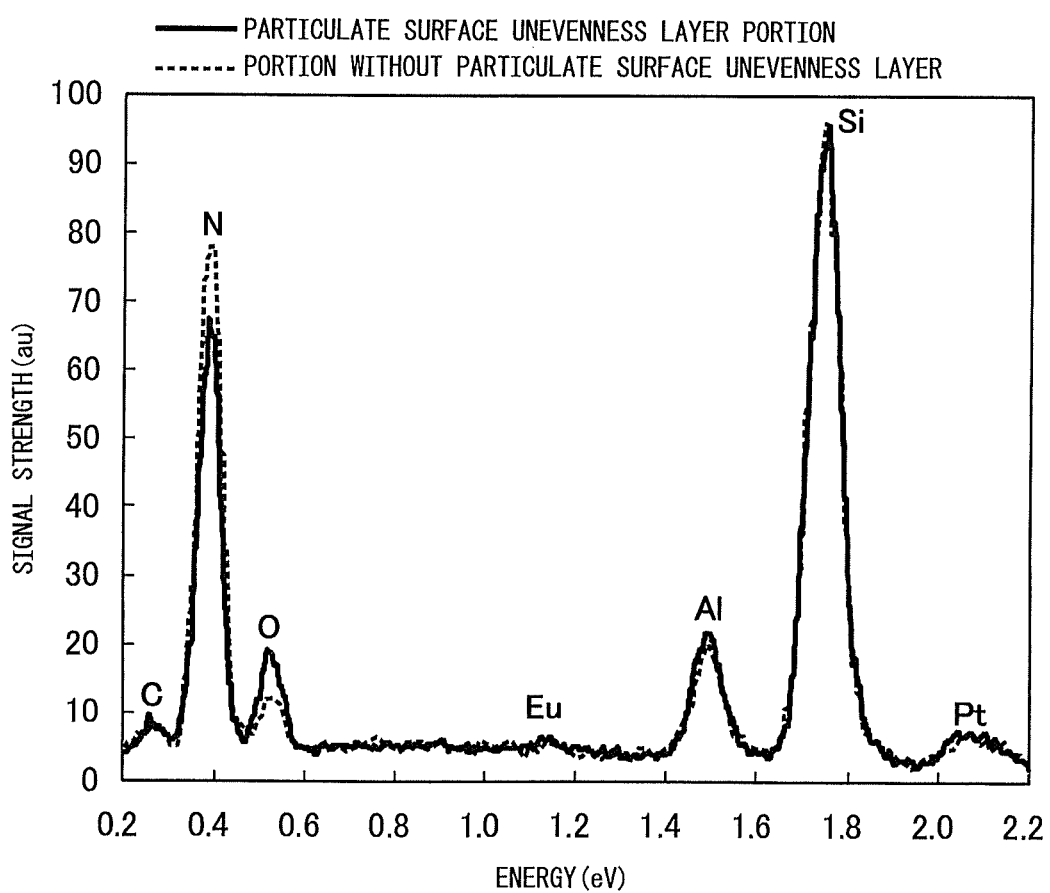

10 μm

LI-CONTAINING α-SIALON-BASED PHOSPHOR PARTICLE, PRODUCTION METHOD THEREOF, LIGHTING DEVICE, AND IMAGE DISPLAY DEVICE

TECHNICAL FIELD

The present invention relates to an optical functional material having a function of converting a part of irradiation light into light having a different wavelength, and a production method thereof. More specifically, the present invention relates to a sialon-based phosphor particle activated by a rare earth metal element, which is suitable for an ultraviolet-to-blue light source. The present invention also relates to a production method of the sialon-based phosphor particle, and a light emitting device and an image display device each using the same.

BACKGROUND ART

Recently, with practical implementation of a blue light-emitting diode (LED), development of a white LED utilizing the blue LED is being aggressively pursued. A white LED ensures low power consumption and extended life compared with existing white light sources, and therefore, its application to liquid crystal panel backlight, indoor or outdoor lighting device, and the like is expanding.

The white LED developed at present is obtained by coating a Ce-doped YAG (yttrium.aluminum.garnet) on a surface of a blue LED. However, the Ce-doped YAG has a fluorescence wavelength in the vicinity of 530 nm and when the color of this fluorescence and the light of a blue LED are mixed to make white light, blue-tinted white light results and good white light cannot be obtained.

On the other hand, an α-sialon-based phosphor activated by a rare earth element is known to emit fluorescence with a longer wavelength than the fluorescence wavelength of Ce-doped YAG (see Patent Document 1). When a white LED is fabricated using fluorescence of this sialon, a white LED giving a bulb color at a lower color temperature than a white LED using YAG can be produced.

However, in order to meet the requirement for various white light sources, α-sialon that emits fluorescence in various colors enabling production of white color sources at various color temperatures has been sought. Therefore, a sialon-based phosphor capable of emitting fluorescence at a shorter wavelength is desired.

In this connection, as understood from Non-Patent Document 1, a Ca-containing α sialon phosphor is reduced in the fluorescence intensity when the fluorescence wavelength is shifted to the shorter wavelength side than 595 nm. Accordingly, it has been difficult to produce a sialon-based phosphor capable of emitting fluorescence at a short wavelength suitable for producing a high-luminance LED of daytime white color or daylight color by combining the phosphor with a blue LED.

To solve this problem, Patent Document 2 discloses a Li (lithium)-containing α-sialon-based phosphor. This sialon can emit fluorescence having a short wavelength compared with the Ca-containing α-sialon-based phosphor. Furthermore, this is a very convenient phosphor, because fluorescence having the same fluorescence wavelength as that of the Ca-containing α-sialon can be emitted and in turn, the range of color tones to which the phosphor can be applied is wide. In Patent Document 2, the phosphor is produced in a nitrogen-containing atmosphere under pressure, but production in an atmosphere under atmospheric pressure is commercially preferred in view of safety and cost of the apparatus. However, production in a nitrogen-containing atmosphere under atmospheric pressure has a problem that a phosphor with high fluorescence intensity cannot be easily produced. This is presumably attributable to the fact that the Li-containing α-sialon undergoes much evaporation of Li in the production process thereof and in turn, the crystal site of Eu as an element for light emission is unstable.

RELATED ART

Patent Document

Patent Document 1: Japanese Unexamined Patent Publication (Kokai) No. 2002-363554
Patent Document 2: WO 2007/004493 A1

Non-Patent Document (Non-Patent Document 1): *J. Phys. Chem.*, B2004, 108, 12027-12031

SUMMARY OF THE INVENTION

Problems to be Solved by the Invention

The present invention has been made to solve these problems of the sialon-based phosphor, and an object of the present invention is to provide a phosphor having high fluorescence intensity and emitting a fluorescence color making it possible to produce a white light-emitting diode of daytime white color or daylight color by combining the phosphor with a blue LED.

Another object of the present invention is to provide a lighting device such as white LED of daytime white color or daylight color by providing an Li-containing α-sialon-based phosphor having high fluorescence intensity and using an ultraviolet or blue LED as a light source.

Still another object of the present invention is to provide a novel production method where a sialon-based phosphor capable of emitting the above-described fluorescence color with high intensity can be obtained in a high yield.

Yet still another object of the present invention is to achieve high luminance and stable color tone of an image evaluation device having an excitation source such as electron beam.

Means to Solve the Problems

The present inventors have made studies on the fluorescence intensity of an α-sialon-based phosphor containing Li and Eu (europium) and found that when an Li source is further mixed with a once-produced Li-containing α-sialon and the mixture is fired, the fluorescence intensity is greatly enhanced, and the present invention has been accomplished based on this finding. It has also been found that the thus-produced Li-containing α-sialon has a special morphology.

In this way, according to the present invention, the following are provided.

[1] An Li-containing α-sialon phosphor particle, which is a lithium-containing α-sialon phosphor particle represented by formula (1):

$$Li_x Eu_y Si_{12-(m+n)} Al_{(m+n)} O_{n+\delta} N_{16-n-\delta} \qquad (1)$$

(wherein $0.4 \leq x \leq 1.5$, $0.001 \leq y \leq 0.2$, $1.0 \leq m \leq 2.8$, $0.1 \leq n+\delta \leq 3.2$, and assuming that the average valence of Eu is a, $x+ya+\delta=m$), wherein the light absorptivity in a wavelength region near 450 nm is 65% or more and the lithium-containing α-sialon phosphor particle has on the surface thereof a sialon surface layer having an uneven surface microstructure formed by particulate sialon with a dimension of 1 μm or less.

[2] The Li-containing α-sialon phosphor particle as described in [1], wherein 0<δ and 0.3≦x/m≦0.9.

[3] The Li-containing α-sialon phosphor particle as described in [1] or [2], wherein the average particle size of the lithium-containing α-sialon phosphor particle is from 0.5 to 30 μm.

[4] The Li-containing α-sialon phosphor particle as described in any one of [1] to [3], wherein the sialon surface layer is a lithium-containing α-sialon and the dimension of the particulate sialon in the sialon surface layer is from 0.01 to 0.8 μm.

[5] The Li-containing α-sialon phosphor particle as described in [1], wherein fluorescence having a peak wavelength of 560 to 590 nm is emitted by injecting excitation light.

[6] A method for producing an Li-containing α-sialon phosphor particle, comprising mixing a silicon nitride or nitrogen-containing silicon compound powder, an AlN-containing substance as an aluminum source, an Li source composed of a nitride, oxynitride or oxide of Li or a precursor substance capable of becoming an oxide of Li by pyrolysis, and an Eu source composed of a nitride, oxynitride or oxide of Eu or a precursor substance capable of becoming an oxide of Eu by pyrolysis, firing the mixture at 1,500 to 1,800° C. in a nitrogen-containing inert gas atmosphere under atmospheric pressure to obtain a lithium-containing α-sialon powder as an intermediate, adding and mixing an additional lithium source to the powder, and re-firing the obtained mixture at a temperature lower than the above firing temperature or at a temperature in a range of 1,100° C. to less than 1,600° C. in a nitrogen-containing inert gas atmosphere under atmospheric pressure.

[7] The method for producing an Li-containing α-sialon phosphor particle as described in [6], wherein the lithium-containing α-sialon phosphor particle obtained by the re-firing is a lithium-containing α-sialon phosphor particle represented by formula (1):

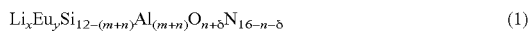

(wherein 0.4≦x≦1.5, 0.001≦y≦0.2, 1.0≦m≦2.8, 0.1≦n+δ≦3.2, and assuming that the average valence of Eu is a, x+ya+δ=m; and 0<δ and 0.3≦x/m≦0.9), in which the light absorptivity in a wavelength region near 450 nm is 65% or more and the lithium-containing α-sialon phosphor particle has on the surface thereof a sialon surface layer having an uneven surface microstructure formed by particulate sialon with a dimension of 1 μm or less.

[8] The method for producing an Li-containing α-sialon phosphor particle as described in [6] or [7], wherein the lithium-containing α-sialon phosphor particle as an intermediate is a lithium-containing α-sialon phosphor particle represented by formula (1):

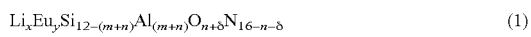

(wherein 0.3≦x<1.2, 0.001≦y≦0.2, 1.0≦m≦2.9, 0.1≦n+δ≦3.2, and assuming that the average valence of Eu is a, x+ya+δ=m) and in the lithium-containing α-sialon phosphor particle obtained by re-firing, x/m is increased by at least 0.02 compared with the lithium-containing α-sialon phosphor particle as an intermediate.

[9] The method for producing an Li-containing α-sialon phosphor particle as described in any one of [6] to [8], wherein the lithium-containing α-sialon phosphor particle as an intermediate has a light absorptivity of 65% or more in a wavelength region near 450 nm.

[10] The method for producing an Li-containing α-sialon phosphor particle as described in any one of [6] to [9], wherein the amount of the additional lithium source is, in terms of metallic Li, from 0.05 to 1.6 mol per mol of the lithium-containing α-sialon powder as an intermediate.

[11] The method for producing an Li-containing α-sialon-based phosphor particle as described in any one of [6] to [10], wherein the Li-containing α-sialon-based phosphor particle obtained by the re-firing emits fluorescence having a peak wavelength of 560 to 590 nm is emitted by injecting excitation light.

[12] A lighting device comprising a light emitting source and a phosphor containing the Li-containing α-sialon-based phosphor particle described in any one of [1] to [5].

[13] The lighting device as described in [12], wherein the light emitting source is an LED capable of emitting light having a wavelength of 330 to 500 nm.

[14] The lighting device as described in [12] or [13], wherein the Li-containing α-sialon-based phosphor particle is combined with a red phosphor of 600 to 650 nm to obtain an emission color of daytime white color or daylight color.

[15] An image display device comprising an excitation source and a phosphor containing the Li-containing α-sialon-based phosphor particle described in any one of [1] to [5].

[16] The image display device as described in [15], wherein the excitation source is an electron beam, an electric field, a vacuum ultraviolet or an ultraviolet ray.

Effects of the Invention

The Li-containing α-sialon-based phosphor of the present invention (hereinafter, referred to as "Li-containing α-sialon-based phosphor as final product") is produced by re-diffusing Li in a once-produced Li-containing α-sialon (hereinafter, referred to as "Li-containing α-sialon-based phosphor as intermediate"), so that an Li-containing α-sialon exhibiting conventionally unobtainable high fluorescence intensity can be obtained and a lighting device such as white LED capable of emitting a color of daytime white color or daylight color can be provided by using an ultraviolet or blue LED as a light source.

BRIEF DESCRIPTION OF THE DRAWINGS

FIG. 2 shows the EDS analysis results of the sample of Example 1.

MODE FOR CARRYING OUT THE INVENTION

Figure 1B:
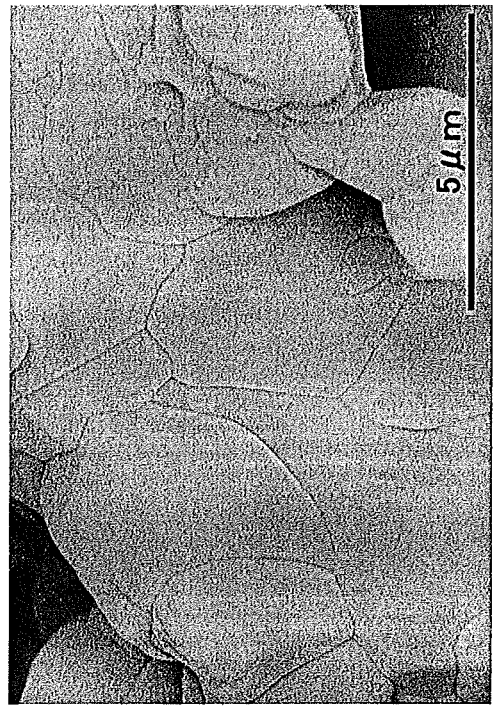
FIGS. 1a and 1b are scanning electron microscopy (SEM) photographs of the sample (particle) of Example 1.

The present invention is described in detail below.
In the present invention, an Li component is added to a once-produced Li-containing α-sialon-based phosphor (intermediate) and then re-fired.
The Li-containing α-sialon-based phosphor particle as final product of the present invention is a sialon represented by formula (1): $Li_xEu_ySi_{12-(m+n)}Al_{(m+n)}O_{n+\delta}N_{16-n-\delta}$. The Li-containing α-sialon-based phosphor before re-firing ("Li-containing α-sialon-based phosphor as intermediate") is also preferably a sialon represented by formula (1): $Li_xEu_y$ $Si_{12-(m+n)}Al_{(m+n)}O_{n+\delta}N_{16-n-\delta}$ but is not limited thereto.

In formula (1), assuming that the average valence of Eu is a, $x+ya+\delta=m$ (provided that $\delta>0$). When an Li-containing α-sialon is produced in a nitrogen-containing atmosphere under atmospheric pressure, an Li-containing α-sialon that can be represented by formula (1), where Li is lacking and Al is excessive, is stably present.

In the Li-containing α-sialon-based phosphor as an intermediate (the Li-containing α-sialon-based phosphor before re-diffusion of Li), $0.3 \leq x<1.2$, preferably $0.45 \leq x<1.2$, more preferably $0.5 \leq x<1.1$, still more preferably $0.6 \leq x<1.0$. If x is less than 0.3, the fluorescence intensity lowers, whereas if it is 1.2 or more, a heterophase is produced and a single-phase α-sialon-based phosphor cannot be obtained. The Li-containing α-sialon-based phosphor as an intermediate is preferably a single-phase α-sialon-based phosphor. In particular, the compositional range satisfying a high fluorescence intensity is $0.4 \leq x<1.2$, furthermore $0.5 \leq x<1.1$. The fluorescence wavelength shifts to short wavelength with an increase in the Li content and can be varied in a range of, in terms of peak wavelength, from 565 to 590 nm.

Eu is an element which is solid-dissolved in the Li-containing α-sialon-based phosphor and works as a light emitting source, and y is preferably $0.001 \leq y \leq 0.2$. If y is less than 0.001, the content of the light emitting source is reduced and a bright phosphor cannot be obtained. Also, if it exceeds 0.2, a sialon emitting fluorescence at a short wavelength cannot be obtained. A preferred range is $0.01 \leq y \leq 0.15$, and a more preferred range is $0.01 \leq y \leq 0.15$.

m and n are $1.0 \leq m \leq 2.9$ and $0.05 \leq n \leq 2.5$. m is a value determined so as to keep electrical neutrality when a metal element is solid-dissolved in sialon, and $m=x+ya+\delta$ (a is the average valence of Eu). The number of Al atoms substituted for Si atom excessively over the number of Al atoms substituted on the cation site corresponding to the number of metal elements (Li and Eu) intruded and existing as a solid solution in the network composed of cation (Si, Al)-anion (O, N)-cation (Si, Al)-anion (O, N) constituting α-sialon is denoted as δ (in present invention, $\delta>0$). If m is less than 1.0, the sialon crystal is hardly stabilized due to the small solid solution amount of metal elements (Li and Eu) and the fluorescence intensity of the phosphor may decrease, whereas if the m value exceeds 2.9, a crystal phase other than sialon is readily produced. n is the value related to the substitution solid-solution amount of oxygen in the Li-containing α-sialon-based phosphor. If the n value is less than 0.05 or $(n+\delta)$ is less than 0.1, the sialon crystal is hardly stabilized due to the small solid solution amount of metal elements (Li and Eu) and the fluorescence intensity may decrease, whereas if the n value exceeds 2.5 or $(n+\delta)$ exceeds 3.2, the absorptivity is disadvantageously reduced or a crystal phase other than sialon is readily produced. Preferred ranges are $1.0 \leq m \leq 2.2$, $0.2 \leq n \leq 2.0$ and $0.8 \leq n+\delta \leq 2.5$, and more preferred ranges are $1.1 \leq m \leq 2.2$, $1.0 \leq n \leq 2.3$ and $1.0 \leq n+\delta \leq 2.0$.

The term "heterophase" as used in the present invention means a crystal phase different from the crystal phases of the Li-containing α-sialon-based phosphor, and this is a heterophase identified by the diffraction pattern of X-ray diffraction and excludes a component not appearing in the X-ray diffraction, such as glass. The single phase means a single crystal phase where a heterophase identified by the diffraction pattern of X-ray diffraction is not present.

The production of the Li-containing α-sialon involves conspicuous evaporation of Li element, which is not caused in the production of other sialons. Such evaporation does not become a problem, for example, in the Ca-containing α-sialon. As the crystal perfection is higher, the phosphor emits fluorescence with higher intensity, and therefore, it is common to perform the synthesis by raising the temperature as much as possible. However, in the case of the Li-containing α-sialon, such a temperature causes a problem that vigorous evaporation of Li occurs and the fluorescence intensity is reduced. To solve this problem, charging a large amount of Li in the raw material by taking into account the evaporation of Li may be considered. The present inventors adopted this countermeasure. Such a method may improve the fluorescence intensity but when intended to obtain higher fluorescence intensity, the firing temperature must be raised, resulting in evaporation of Li. In the present invention, as a first step, the Li-containing α-sialon is produced by raising the firing temperature with an attempt to form a crystal framework while ignoring the evaporation of Li. In this state, the characteristics are reduced due to lack of Li resulting from evaporation of Li and therefore, only Li is supplied to the crystal to make a more perfect crystal. This method utilizes the feature that the Li element may diffuse in a relatively small ionic radius, by taking advantage of the characteristics of the Li element, and the present inventors have first verified the effectiveness thereof and provide the Li-containing α-sialon phosphor particle of the present invention. Moreover, it can be presumed from the morphological feature that there is an effect of not simple re-diffusion but specific diffusion of Li.

Figure 1A:
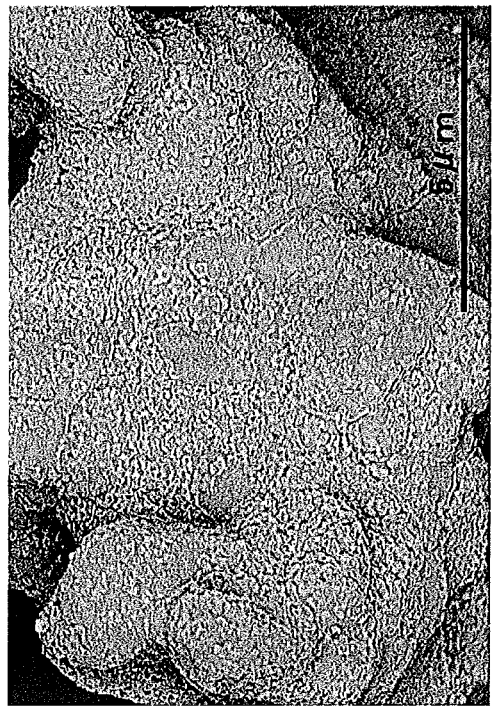

FIG. 1a shows the morphology of the phosphor particle of the thus-obtained Li-containing α-sialon. It looks as if fine particles are attached to the surface of the particle, and an uneven surface (microstructure) is formed. For comparison, the particle morphology of the intermediate sample before re-diffusion of Li was observed (FIG. 1b). In this case, fine grains (unevenness) were not observed on the surface. From these, it is undoubtable that addition of the Li source participates in the production of the fine particulate material on the surface. The composition of the fine particulate material was analyzed by EDS (energy-dispersive X-ray spectroscopy), as a result, it was confirmed that the fine particulate material attached to the surface is not $Li_2O$ but sialon (see, FIG. 2). When the Li re-diffusion temperature exceeds 1,600° C., the fluorescence characteristics are again being reduced, and observation of the phosphor particle reduced in the fluorescence intensity reveals that fine particulate material looking as if attached to the surface disappeared and the particle became again an Li-containing α-sialon particle free from an uneven surface microstructure with a fine particulate material (see, FIG. 3). It is considered that when the Li-containing α-sialon phosphor particle is enhanced in the characteristics by re-diffusion of Li, fine particles (particulate uneven structure; uneven surface microstructure) appear on the surface.

In the Li-containing α-sialon-based phosphor as a final product (the Li-containing α-sialon-based phosphor after re-diffusion of Li), the value of x is increased from $0.3 \leq x<1.2$ in the Li-containing α-sialon-based phosphor particle as an intermediate to $0.4 \leq x \leq 1.5$, preferably $0.5 \leq x \leq 1.4$, more preferably $0.6 \leq x \leq 1.35$. However, the fluorescence intensity of the Li-containing α-sialon-based phosphor as a final product is enhanced even when $0.4 \leq x<1.2$. If x is less than 0.4, the fluorescence intensity is reduced, and even if it exceeds 1.5, the fluorescence intensity cannot be increased. The Li-containing α-sialon-based phosphor as a final product is preferably a single phase, but there is no problem even when a slight amount of a heterophase is present within an extent not impairing the fluorescence characteristics and the fluorescence intensity. In particular, the compositional range satisfying a high fluorescence intensity is $0.5 \leq x \leq 1.5$, furthermore $0.6 \leq x \leq 1.31$. The fluorescence wavelength shifts to short wavelength with an increase in the Li content and can be varied in a range of, in terms of peak wavelength, from 565 to 590 nm.

The values of y, m, n, δ and (n+δ) are, including preferred ranges, basically the same as those in the Li-containing α-sialon-based phosphor particle as the intermediate, but the upper limit of m is 2.8.

The Li-containing α-sialon-based phosphor particle as a final product of the present invention is characterized by δ>0, but in particular, it is preferred that δ is from 0.05 to 1.1 and the ratio x/m between x and m is from 0.3 to 0.9, because the fluorescence intensity becomes high. It is more preferred that δ is from 0.05 to 1.0 and the x/m ratio is from 0.4 to 0.6. The Li-containing α-sialon-based phosphor particle as a final product of the present invention is characterized in that the ratio x/m between x and m is increased as compared with the Li-containing α-sialon-based phosphor particle as an intermediate, and an increase by at least 0.02 is preferred. Furthermore, an increase by 0.03 or more, by 0.04 or more, or by 0.06 or more, is more preferred. Incidentally, in the Li-containing α-sialon-based phosphor particle as an intermediate, the ratio x/m between x and m is preferably 0.3 or more but may be less than 0.3, for example, may be 0.2, further 0.15.

The Li-containing α-sialon phosphor particle body may be either a primary particle or a secondary particle, but the dimension thereof is generally from 0.5 to 30 μm, preferably from 1 to 20 μm, more preferably from 5 to 20 μm. In the case of a secondary particle, the dimension of its primary particle is preferably from 0.5 to 8 more preferably from 1 to 5 μm. As for the particle size of the Li-containing α-sialon phosphor particle, the longest diameter and the shortest diameter of respective particles are measured on the SEM photograph and after determining an equivalent-circle radius from an elliptical circle based on the longest diameter and the shortest diameter, the obtained value may be taken as the particle size. The average particle size may be a number average particle size.

The surface layer having an uneven microstructure and covering the surface of the Li-containing α-sialon phosphor particle body is formed by a sialon, particularly an Li-containing α-sialon, having a dimension (average diameter determined by SEM observation) of 1 μm or less. The particulate sialon present on the surface of the phosphor particle body may be further 0.5 μm or less, 0.3 μm or less, or 0.2 μm or less. The lower limit of the dimension is not particularly limited but is generally 0.001 μm, or 0.01 μm. As seen in FIG. 1a, such a fine particulate sialon covers almost the entire surface of the Li-containing α-sialon particle body and forms an uneven surface.

The surface layer having an uneven microstructure formed on the surface of the Li-containing α-sialon particle is a sialon phase and may have the same material as the Li-containing α-sialon particle body. The "same material" as used herein means a sialon having a configuration where at least the constituent elements (Li, Eu, Si, Al, O, N) are the same, and the surface layer preferably has the composition represented by formula (1) but is not limited thereto. This is a surface layer composed of sialon formed on the surface when Li is mixed with the Li-containing α-sialon particle body as an intermediate to diffuse Li into the inside of the particle and increase the proportion of Li contained in the particle. The constituent elements of the sialon surface layer are confirmed to be the same as those of the Li-containing α-sialon particle body, but it may be sufficient if Li is internally diffused in the Li-containing α-sialon particle body to increase the Li content of the body, and the surface layer need not be a sialon having the same crystal phase and the same composition as those of the body, though this is preferred.

Figure 4:
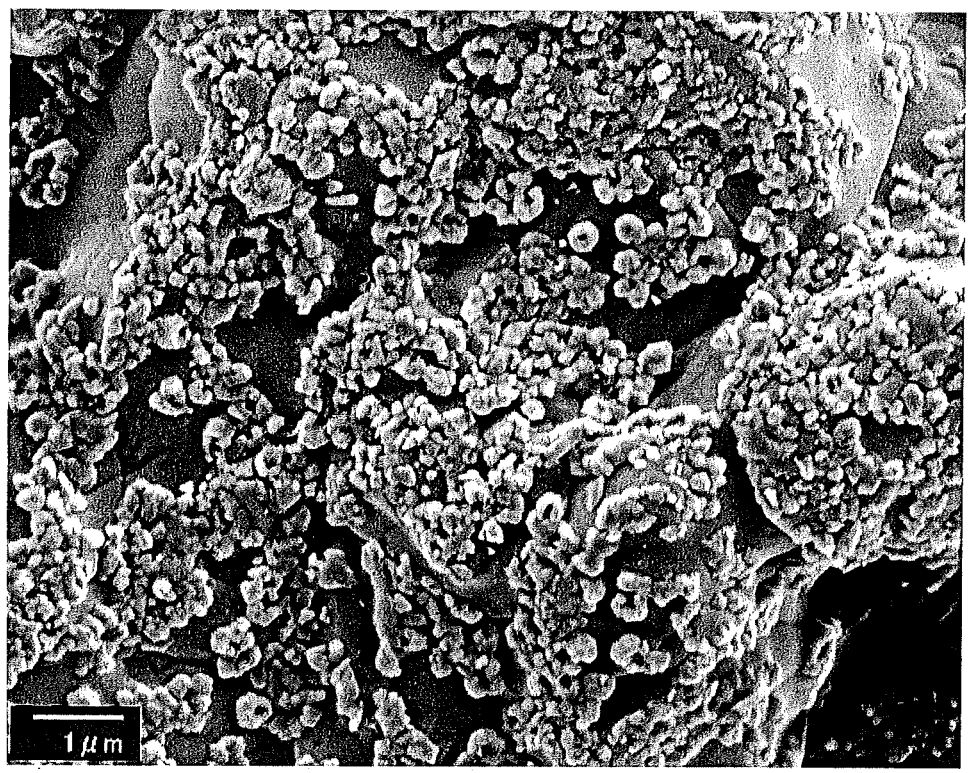
FIG. 4 is a photograph showing the particle morphology observed by SEM of the sample (particle) of Example 9 in which the fluorescence intensity is enhanced by the re-diffusion of Li at 1,600° C.

The uneven microstructure formed on the surface is undoubtedly owing to the addition of Li, but whether the sialon is produced on the surface by using Li attached to the surface as the core or the solid-dissolved Li is diffused on the surface to form a new sialon on the surface is unknown at this time. If the former, the sialon is considered to be attached as a particle to the surface, and if the latter, the sialon is understood as a deformation of the mother-body sialon particle. The inventors believe that the latter is more likely, because the material attached to the surface is not observed as a distinct particle on the SEM photograph of FIG. 1a. While FIG. 1a is the sample re-fired at 1,400° C., FIG. 4 shows the results when the surface of the sample treated at 1,600° C. of Example 9 was observed, where the material apparently looks like a particle. From these, although not wishing to be bound by theory, the inventors estimate the process where Li diffused at low temperature forms unevenness on the surface while gathering on the surface and the unevenness becomes a particle and is finally evaporated. In this meaning, even if the attached material looks like a particle, it is not believed that a particle comes in externally and is attached.

The crystallinity perfection of the Li-containing α-sialon phosphor particle provided by the present invention is indicated by the crystallographic index such as the half-value width of the X-ray diffraction peak but, as for the phosphor particle of the present invention, can be indirectly evaluated by light absorptivity, fluorescence intensity or the like.

The absorptivity near 450 nm of the Li-containing α-sialon phosphor particle is preferably 65% or more, more preferably 70% or more, still more preferably 80% or more. As the absorptivity is higher, the effect of re-diffusion of Li is more prominently developed. If the absorptivity is less than 65%, the effect of re-diffusion decreases.

The method for producing the sialon-based phosphor powder of the present invention is described below.

(Production of Li-Containing α-Sialon-Based Phosphor Powder Before Re-Diffusion of Li of the Present Invention)

In the production of Li-containing α-sialon-based phosphor powder, a silicon nitride powder, an AlN-containing substance as an aluminum source, an a Li source composed of a nitride, oxynitride or oxide of Li or a precursor substance capable of becoming an oxide of Li by pyrolysis, and an Eu source composed of a nitride, oxynitride or oxide of Eu or a precursor substance capable of becoming an oxide of Eu by pyrolysis are weighed to give a calculated Li-containing α-sialon-based phosphor composition and mixed to obtain a mixture. Here, the calculated Li-containing α-sialon-based phosphor composition is a composition represented by $Li_x Eu_y Si_{12-(m+n)} Al_{(m+n)} O_n N_{16-n}$ but may be a composition in which Li is excessively added.

As the raw material silicon nitride or nitrogen-containing silane compound powder, crystalline silicon nitride, or a nitrogen-containing silane compound and/or an amorphous silicon nitride powder may be used.

The nitrogen-containing silane compound and/or amorphous silicon nitride powder, which are a main raw material, can be obtained by a known method, for example, by decomposing an Si—N—H-based precursor compound such as silicon diimide produced through the reaction of a silicon halide such as silicon tetrachloride, silicon tetrabromide and silicon tetraiodide with ammonia in a gas phase or liquid phase state, under heating at 600 to 1,200° C. in a nitrogen or ammonia gas atmosphere. The crystalline silicon nitride powder can be obtained by firing the obtained nitrogen-containing silane compound and/or amorphous silicon nitride powder at 1,300 to 1,550° C. The crystalline silicon nitride can be obtained by directly nitriding a metal silicon in a nitrogen atmosphere, but this method requires a pulverization step to obtain a fine powder and therefore, readily allows for mingling of impurities. For this reason, a method of decomposing a precursor, where a highly pure powder can be easily obtained, is preferably employed.

As for the nitrogen-containing silane compound and/or amorphous silicon nitride powder and the crystalline silicon nitride powder, a material having an oxygen content of 1 to 5 mass % is used. A material having an oxygen content of 1 to 3 mass % is preferred. If the oxygen content is less than 1 mass %, it becomes very difficult to produce an α-sialon phase by the reaction in the firing process, and remaining of a crystal phase of the starting material or production of AlN polytypes such as 21R is disadvantageously liable to occur, whereas if the oxygen content exceeds 5 mass %, the proportion of β-sialon or oxynitride glass produced increases, though the α-sialon production reaction is accelerated.

Also, as for the nitrogen-containing silane compound and/or amorphous silicon nitride powder, a material having a specific surface area of 80 to 600 m²/g is preferably used. A material having a specific surface area of 340 to 500 m²/g is more preferred. In the case of crystalline silicon nitride, a raw material having a specific surface area (BET specific surface area) of 1 to 15 m²/g is preferably used.

The substance working out to the aluminum source includes aluminum oxide, metal aluminum and aluminum nitride, and these powders each may be used alone or may be used in combination. As for the aluminum nitride powder, a general powder having an oxygen content of 0.1 to 8 mass % and a specific surface area of 1 to 100 m²/g can be used.

The lithium (Li) source is selected from nitride, oxynitride and oxide of Li and a precursor substance capable of becoming an oxide of Li by pyrolysis, and examples thereof include lithium oxide ($Li_2O$), lithium carbonate ($Li_2CO_3$) and lithium nitride ($Li_3N$), with $Li_2O$ being most preferred. Lithium carbonate is not preferred because of release of extra carbon dioxide gas. $Li_3N$ is oxidized in the atmosphere, making its handling difficult.

The Eu source is selected from nitride, oxynitride and oxide of Eu and a precursor substance capable of becoming an oxide of Eu by pyrolysis, and examples thereof include europium oxide ($Eu_2O_3$), europium carbonate ($Eu_2(CO_3)_3$) and europium nitride (EuN), with $Eu_2O_3$ being most preferred. Europium carbonate is not preferred because of release of extra carbon dioxide gas. EuN is oxidized in the atmosphere, making its handling difficult.

The precursor substance capable of becoming an oxide of Li or Eu by pyrolysis includes respective metal salts such as carbonate, oxalate, citrate, basic carbonate and hydroxide.

In the present invention, the amount of metal impurities other than the constituent components of the Li-containing α-sialon-based phosphor is preferably controlled to 0.01 mass % or less. In particular, as for the nitrogen-containing silane compound and/or amorphous silicon nitride powder or the crystalline silicon nitride, which are added in a large amount, as well as aluminum oxide and AlN, the content of metal impurities in the material used is 0.01 mass % or less, preferably 0.005 mass % or less, more preferably 0.001 mass %. As for the oxide of metal Li or the precursor substance capable of becoming an oxide of Li by pyrolysis and the oxide of metal Eu or the precursor capable of becoming an oxide of Eu by pyrolysis, use of a material giving an oxide having a metal impurity content of 0.01 mass % or less is also preferred.

The method for mixing respective starting materials described above is not particularly limited, and a known method, for example, a method where the materials are dry mixed, or a method where the materials are wet mixed in an inert solvent substantially incapable of reacting with respective components of the raw material and then the solvent is removed, may be employed. A mixing device such as V-type mixer, rocking mixer, ball mill, vibration mill and medium stirring mill is suitably used. However, the nitrogen-containing silane compound and/or amorphous silicon nitride powder are highly sensitive to moisture and humidity and, therefore, the mixing of starting materials must be performed in a controlled inert gas atmosphere.

The mixture of starting materials is fired at 1,400 to 1,800° C., preferably at 1,500 to 1,800° C., more preferably at 1,600 to 1,750° C., in a nitrogen-containing inert gas atmosphere under atmospheric pressure to obtain the desired Li-containing α-sialon-based phosphor powder. Examples of the inert gas include helium, argon, neon and krypton, and such a gas may also be used by mixing it with a small amount of hydrogen gas. If the firing temperature is less than 1,400° C., an impractically long period of heating is required for the production of the desired Li-containing α-sialon-based phosphor powder, and the proportion of Li-containing α-sialon-based phosphor phase in the powder produced is also reduced. If the firing temperature exceeds 1,800° C., there arises an undesirable problem that silicon nitride and sialon are sublimated and decomposed to produce free silicon. The Li-containing α-sialon after firing is different from the charge composition due to evaporation of Li or the like.

The heating furnace used for firing of the powder mixture is not particularly limited and, for example, a high-frequency induction heating- or resistance heating-system batch-type electric furnace, a rotary kiln, a fluidizing firing furnace and a pusher-type electric furnace may be used. As for the firing crucible, a BN-made crucible, a silicon nitride-made crucible, a graphite-made crucible and a silicon carbide-made crucible may be used. In the case of a graphite-made crucible, the inner wall is preferably coated with silicon nitride, boron nitride or the like.

(Re-Dispersion of Li in Li-Containing α-Sialon-Based Phosphor Powder of the Present Invention)

Next, the produced Li-containing α-sialon and the Li source powder to be diffused are weighed and mixed. As for the raw material as for the Li source, as described above, nitride, oxynitride and oxide of Li and a precursor substance capable of becoming an oxide of Li by pyrolysis may be employed. The Li-containing α-sialon and the Li source are mixed using a mixer such as vibration mill, the mixture is put in a crucible such as alumina-made crucible, BN-made crucible, silicon nitride-made crucible and carbon-made crucible, and firing is performed in a nitrogen-containing atmosphere under atmospheric pressure. The firing temperature may be sufficient if it is a temperature lower than the firing temperature when producing the Li-containing α-sialon as intermediate, but a temperature of 1,100 to 1,600° C. is generally employed. The temperature is preferably from 1,300 to 1,500° C., more preferably from 1,350 to 1,450° C. If the temperature is less than 1,100° C., the effect of improving the fluorescence intensity is reduced, whereas if it exceeds 1,600° C., evaporation of Li is increased to reduce the effect of enhancing the fluorescence intensity and reduction in the fluorescence intensity may be rather caused. Also, even if the firing temperature for re-diffusing Li is a temperature higher than the firing temperature at the production of producing the Li-containing α-sialon as an intermediate, when the firing temperature is in a range of 1,100 to 1,600° C., the effect of re-diffusing the additional Li can be obtained to a certain extent. As the gas other than nitrogen in the nitrogen-containing atmosphere, an inert gas can be used, and examples of the inert gas include helium, argon, neon and krypton. In the present invention, such a gas may also be used by mixing it with a small amount of hydrogen gas.

The holding time at the firing temperature is preferably from 0.5 to 5 hours. If the holding time is less than 0.5 hours, the reaction may not sufficiently proceed, and even if it exceeds 5 hours, although the effect of enhancing the fluorescence intensity may be developed, a significant effect is not obtained and the production cost disadvantageously rises.

The fired powder is weakly fused after taking it out of the crucible, and therefore, is lightly dissociated. A glass layer or the like adhering to the particle surface is removed, if desired, and then, evaluated as a phosphor.

The heating furnace used for re-diffusion of Li is not particularly limited and, for example, a high-frequency induction heating- or resistance heating-system batch-type electric furnace, a rotary kiln, a fluidizing firing furnace and a pusher-type electric furnace may be used. As for the firing crucible, an alumina crucible, a BN-made crucible, a silicon nitride-made crucible, a graphite-made crucible and a silicon carbide-made crucible may be used. In the case of a graphite-made crucible, the inner wall is preferably coated with silicon nitride, boron nitride or the like.

In the thus-obtained Li-containing α-sialon-based phosphor, a glass layer is attached to the surface and for obtaining a phosphor having a higher fluorescence intensity, the glass layer is preferably removed. The easiest way to remove the glass layer on the phosphor particle surface is washing with an acid, that is, a treatment of putting the sialon particle in the solution of an acid selected from sulfuric acid, hydrochloric acid and nitric acid and removing the glass layer on the surface. The concentration of the acid solution is from 0.1 to 7 N, preferably from 1 to 3 N. If the concentration is excessively high, oxidation aggressively proceeds and good fluorescence characteristics cannot be obtained. In an acid solution whose concentration is adjusted, the sialon-based phosphor powder is put in an amount of 5 wt % based on the solution and kept for a desired time with stirring. After the washing, the solution containing the sialon-based phosphor powder is filtered, washed with water to flush out the acid, and dried.

The rare earth element-activated Li-containing α-sialon-based phosphor of the present invention is kneaded with a transparent resin such as epoxy resin and acrylic resin by a known method to produce a coating agent, and a light-emitting diode whose surface is coated with the coating agent can be used as a light-emitting device for various lighting devices.

In particular, a light emitting source in which the peak wavelength of excitation light is from 330 to 500 nm is suitable for the Li-containing α-sialon-based phosphor. In the ultraviolet region, the luminous efficiency of the Li-containing α-sialon-based phosphor is high and a light-emitting device having good performance can be fabricated. A high luminous efficiency is also obtained using a blue light source and by combining yellow fluorescence of the Li-containing α-sialon-based phosphor and blue excitation light, a light-emitting device giving good daytime white color or daylight color can be fabricated.

Furthermore, by combining a red phosphor of 600 to 650 nm for adjustment of color tone, the emission color of daytime white color or daylight color can be controlled to a warm bulb color region. The light-emitting device of such bulb color can be widely used for general domestic lighting. In accordance with JIS, the daytime white color is, in terms of correlated color temperature, a color of 4,600 to 5,500 K, and the daylight color is, in terms of correlated color temperature, a color of 5,700 to 7,100 K.

Also, an image display device can be fabricated using the Li-containing α-sialon-based phosphors. In this case, the above-described light-emitting device may be used, but the Li-containing α-sialon-based phosphor can also be directly excited to emit light by using an excitation light such as an electron beam, electric field or ultraviolet ray, for example, can be used on the principle like that of a fluorescent lamp. Even with such a light-emitting device, an image display device can be fabricated.

EXAMPLES

The present invention is described in greater detail below by referring to specific examples.

Production of Law Material Li-α-Sialon
(Intermediate)

First, production of Li-containing sialons having various compositions was performed. An example of the specific production method is described.

Amorphous silicon nitride produced by reacting silicon tetrachloride and ammonia, or crystalline silicon nitride, and europium oxide (produced by Shin-Etsu Chemical Co., Ltd., REU grade, 99.99%), lithium carbonate (produced by Rare Metallic Co., Ltd., 99.9%), aluminum nitride (produced by Tokuyama Corp., Type E, 99.9%), and aluminum oxide (produced by Sumitomo Chemical Co., Ltd. AKP-30, 99.9%) were weighed according to m and n shown in Table 1. Incidentally, for the calculation of m value and n value, Li-α-sialon $Li_xEu_ySi_{12-(m+n)}Al_{(m+n)}O_nN_{16-n}$ (wherein x+ay=m, a is the average valence of Eu and was trivalent at the time of raw material) at a stoichiometric ratio was assumed. The raw materials weighed were mixed using a dry vibration mill in a nitrogen atmosphere to obtain a mixed powder. This powder was put in a silicon nitride-made crucible, charged into an electric furnace and after raising the temperature while flowing nitrogen under atmospheric pressure, held at the holding temperature shown in Table 1 for 12 hours, thereby fired, to obtain Li-α-sialon.

JASCO Corporation. Incidentally, the excitation wavelength of measurement was set to 450 nm. The results are shown in Table 1. The fluorescence intensity in Examples (Tables 1 to 3) in the description of the present invention is shown by a relative intensity to the fluorescence intensity of sialon denoted by S4 in Table 1, which is taken as 100.

TABLE 1

| Li-α-Sialon | Weighing Formulation | | | Raw Material Morphology of Silicon Nitride | Firing Temperature | | | | | | | Peak Wavelength | Absorptivity | Fluorescence |
|---|---|---|---|---|---|---|---|---|---|---|---|---|---|---|
| No. | m | n | y | | °C. | x | y | m | n | n+δ | δ | x/m | (nm) | (%) | Intensity (%) |
| S1 | 1.0 | 0.5 | 0.10 | amorphous | 1650 | 0.56 | 0.07 | 1.36 | 0.36 | 0.94 | 0.58 | 0.41 | 585 | 81.8 | 88 |
| S2 | 2.5 | 1.0 | 0.20 | crystalline | 1700 | 0.86 | 0.12 | 2.27 | 0.55 | 1.68 | 1.13 | 0.38 | 583 | 78.1 | 48 |
| S3 | 1.0 | 0.3 | 0.10 | amorphous | 1700 | 0.55 | 0.07 | 1.31 | 0.35 | 0.92 | 0.57 | 0.42 | 585 | 82.6 | 90 |
| S4 | 2.8 | 0.3 | 0.10 | amorphous | 1725 | 0.99 | 0.09 | 1.79 | 0.58 | 1.09 | 0.51 | 0.55 | 585 | 81.3 | 100 |
| S5 | 2.0 | 1.0 | 0.10 | amorphous | 1725 | 1.11 | 0.08 | 1.98 | 0.63 | 1.25 | 0.62 | 0.56 | 583 | 79.7 | 80 |
| S6 | 1.5 | 2.8 | 0.08 | amorphous | 1725 | 0.69 | 0.03 | 3.27 | 0.37 | 2.50 | 2.13 | 0.21 | 576 | 64.7 | 103 |
| S7 | 0.8 | 4.0 | 0.04 | amorphous | 1725 | 0.34 | 0.01 | 4.02 | 0.18 | 3.17 | 2.99 | 0.09 | 572 | 51.6 | 49 |

The composition of the thus-obtained Li-α-sialon differs from the charge composition. After the firing, the powder taken out was washed with a 2 N nitric acid solution to remove the glass layer on the surface, and this sample was measured using an oxygen nitrogen simultaneous analysis apparatus manufactured by LECO for oxygen and nitrogen and analyzed using ICP (inductively-coupled plasma spectrometry) for other elements. The composition of the sialon was calculated from the analysis results and is shown in Table 1. Incidentally, the valence of Eu was divalence. Also, due to analytic error, m=x+ay+δ is not necessarily satisfied.

Incidentally, the analysis by ICP is as follows. As for Li, the sample was acidolyzed with nitric acid and hydrofluoric acid under pressure, sulfuric acid was added thereto, the resulting mixture was concentrated by heating until a white fume was generated, hydrochloric acid was added thereto and after dissolving under heating, the resulting solution was quantitatively analyzed by the ICP-AES method using Model SPS5100 manufactured by SII Nanotechnology. As for Si, the sample was melted by overheating with sodium carbonate and boric acid and then dissolved with hydrochloric acid, and the obtained solution was quantitatively analyzed in accordance with the coagulation gravimetric method. As for Al and Eu, the filtrate obtained in the pretreatment of the quantitative analysis of Si was collected and quantitatively analyzed by ICP-AES.

Identification of the crystal phase was performed by X-ray diffraction, as a result, with respect to S1 to S5, the sample was a sialon single phase, but with respect to S6 and S7, a 12H-type crystal that is a polymorphism of AlN was contained as a heterophase in addition to sialon. Since the sample contains a heterophase, in the compositional table of Table 1, the compositions for S6 and S7 are not a sialon composition but calculation results on the assumption that the entire composition is a sialon. Therefore, the compositions of S6 and S7 have no physical meaning. In S1 to S5, the calculated δ is positive, revealing that compared with normal Li-α-sialon, there was a lack of Li and excessive Al.

These powders were further evaluated for the peak wavelength and peak intensity of fluorescence and the absorptivity by using FP-6500 with an integrating sphere manufactured by Re-Diffusion of Li in Raw Material Li-α-Sialon Examples 1 to 5

Lithium oxide ($Li_2O$, Kojundo Chemical Laboratory Co., Ltd., 99.0%) was added in the quantity shown in Table 2 per mol of the Li-α-sialon shown in Table 1, and these were mixed by using a vibration mill. The obtained powder was put in an alumina crucible and heated at a temperature rise rate of 300° C./h under the firing conditions shown in Table 2. After the firing, the sample was acid-washed with a 2 N nitric acid solution, and the measurement of composition and the fluorescence measurement were performed by the methods described above. The results are shown in Table 2. It is seen that the fluorescence intensity is greatly improved. The results of the composition analysis are also shown in Table 2. It is seen that Li and oxygen are increased. As one of reasons for improvement of fluorescence characteristics, increase of Li that was lacked may participate therein. Incidentally, the variation (percent change) shown in Table 2 is a value obtained by dividing the increment in the fluorescence intensity by the fluorescence intensity of the raw material sialon (S1 to S7) used (i.e., the percentage change of the fluorescence intensity).

FIG. 1a shows the SEM photograph of the sialon particle obtained. The material attached to the surface of the mother-body sialon particle is not observed as a distinct particle and therefore, the material attached to the surface is considered to be a deformation of the mother-body sialon particle.

Comparative Examples 1 and 2

Re-diffusion of Li was performed by the same method as in Example 1 except for using the sialon (S6, S7) shown in Table 2. As a result, it was confirmed that the fluorescence intensity is somewhat improved by the Li re-diffusion. The absorptivity of the raw material sialon (S6, S7) used in Comparative Examples 1 and 2 is less than 65%, and the effect of Li re-diffusion cannot be obtained in a Li-α-sialon having such a low absorptivity.

TABLE 2

| | Number of Sialon Used | Reagent Added | Additional Amount (mol) | Firing Temperature (°C.) | Firing Time (h) | Crucible Used | Presence or Absence of Surface Unevenness | Peak wavelength (nm) |
|---|---|---|---|---|---|---|---|---|
| Example 1 | S1 | Li2O | 0.15 | 1400 | 1 | alumina | uneven | 588 |
| Example 2 | S2 | Li2O | 0.15 | 1400 | 1 | alumina | uneven | 588 |
| Example 3 | S3 | Li2O | 0.15 | 1300 | 1 | alumina | uneven | 586 |
| Example 4 | S4 | Li2O | 0.15 | 1300 | 1 | alumina | uneven | 584 |
| Example 5 | S5 | Li2O | 0.15 | 1300 | 1 | alumina | uneven | 585 |
| Comparative Example 1 | S6 | Li2O | 0.15 | 1300 | 1 | alumina | uneven | 577 |
| Comparative Example 2 | S7 | Li2O | 0.15 | 1300 | 1 | alumina | uneven | 573 |

| | Absorptivity (%) | Fluorescence Intensity (%) | Variation (%) | x | y | m | n | n + δ | δ | x/m |
|---|---|---|---|---|---|---|---|---|---|---|
| Example 1 | 82.2 | 158.2 | 80 | 0.65 | 0.07 | 1.35 | 0.39 | 1.01 | 0.62 | 0.48 |
| Example 2 | 78.2 | 117.6 | 145 | 1.23 | 0.12 | 2.59 | 0.73 | 1.76 | 1.03 | 0.47 |
| Example 3 | 81.6 | 148.6 | 66 | 0.60 | 0.07 | 1.33 | 0.37 | 1.01 | 0.64 | 0.45 |
| Example 4 | 79.5 | 134.0 | 34 | 1.31 | 0.08 | 2.13 | 0.73 | 1.30 | 0.57 | 0.61 |
| Example 5 | 78.3 | 125.8 | 57 | 1.31 | 0.07 | 2.19 | 0.73 | 1.47 | 0.75 | 0.60 |
| Comparative Example 1 | 61.1 | 106.5 | 3 | 0.81 | 0.02 | 3.52 | 0.43 | 2.70 | 2.27 | 0.23 |
| Comparative Example 2 | 48.1 | 52.6 | 8 | 0.49 | 0.01 | 4.16 | 0.25 | 3.36 | 3.11 | 0.12 |

Comparative Examples 3 to 7

Re-diffusion of Li was performed by the same method as in Example 1 except for using the sialon (S3 to S5) shown in Table 3 and changing the treatment temperature to 1,000° C. In the samples having a high absorptivity, the fluorescence intensity is improved similarly to Examples 3 to 5. However, the degree of improvement is small, as a result, a desired absolute fluorescence intensity is not attained. At a temperature as low as 1,000° C., the effect of re-diffusion cannot be sufficiently obtained. In Comparative Examples 6 and 7, in addition to the firing condition of 1,000° C., the absorptivity of the raw material is less than 65%. Under such conditions, the effect of re-diffusion of Li is not obtained at all.

Examples 6 to 8

Re-diffusion of Li was performed by the same method as in Example 1 except for using the sialon (S3 to S5) shown in Table 3 and prolonging the treatment temperature to 5 hours. The fluorescence characteristics are improved. However, as compared with those of Examples 3 to 5, the degree of improvement is nearly unchanged. In the treatment, the temperature is more important than the time.

Comparative Examples 8 and 9

Re-diffusion of Li was performed by the same method as in Example 1 except for using the sialon (S6, S7) shown in Table 3 and prolonging the treatment temperature to 5 hours. As a result, it was confirmed that the fluorescence intensity is less improved by the re-diffusion of Li. The raw material sialon (S6, S7) used in Comparative Examples 8 and 9 is less than 65% and as to an Li-α-sialon having such a low absorptivity, even when the Li re-diffusion time is prolonged, the effect of re-diffusion of Li cannot be obtained.

Example 9

Re-diffusion of Li was performed by the same method as in Example 1 except for using the sialon (S3) shown in Table 3 and changing the treatment temperature to 1,600° C. As seen from Table 3, the fluorescence intensity was improved, similarly to Example 3.

Comparative Examples 10 and 11

Re-diffusion of Li was performed by the same method as in Example 1 except for using the sialon (S4, S5) shown in Table 3 and changing the treatment temperature to 1,600° C. The absorptivity of the sample used was 65% or more, and the effect was obtained at 1,300° C. similarly to Examples 4 and 5, but at 1,600° C., the effect of improving the fluorescence intensity was not seen. When the treatment is increased, the effect tends to not be obtained.

Comparative Example 12

Firing was performed by the same method as in Example 1 except for using the sialon (S3) shown in Table 3 and not adding Li. The fluorescence intensity was not improved. It is understood that the effect of the present invention is produced due to the addition of Li.

Examples 10 and 11

Re-diffusion of Li was performed by the same method as in Example 1 except for using the sialon (S3) shown in Table 3 and changing the amount added of Li. The fluorescence intensity was improved. It was seen that even when the amount added is 0.03 mol in terms of Li2O, a sufficiently large effect is obtained. On the other hand, even if the amount added was increased to 0.75 mol in terms of Li2O, the variation was not increased as compared with Example 3. These results reveal that an increase in the amount added does not lead to greater improvement of the fluorescence intensity.

Example 12

Re-diffusion of Li was performed by the same method as in Example 1 except for using the sialon (S3) shown in Table 3 and adding lithium carbonate as the Li source in the amount shown in Table 3. The fluorescence intensity was improved.

Example 13

Re-diffusion of Li was performed by the same method as in Example 1 except for using the sialon (S3) shown in Table 3, adding lithium nitride as the Li source in the amount shown in Table 3, and preparing the raw material while keeping it from contact with oxygen by mixing the powder in a nitrogen box. The fluorescence intensity was improved.

Example 14

Re-diffusion of Li was performed by the same method as in Example 1 except for using the sialon (S3) shown in Table 3 and using a boron nitride crucible as the crucible. The fluorescence intensity was improved.

Change in Composition and Morphology of Particle

With respect to the sample of Example 1, the particle morphology was observed using a scanning electron microscope (SEM). For comparison, the particle morphology in the sample (S1) before re-diffusion of Li was also observed. The results are shown in FIG. 1(a) and FIG. 1(b), respectively. An uneven microstructure by a particulate material of 1 μm or less, specifically about 0.2 μm, was observed on the particle surface due to re-diffusion. In the sample before treatment, a particulate uneven microstructure is not observed on the surface.

Re-firing was performed without adding Li as in Comparative Example 12, and the particle was observed by SEM, but the surface morphology of the particle was not changed. Accordingly, it can be said that the change on the particle surface emerges due to re-diffusion of Li.

TABLE 3

| | Number of Sialon Used | Reagent Added | Additional Amount (mol) | Firing Temperature (° C.) | Firing Time (h) | Crucible Used | Presence or Absence of Surface Unevenness | Peak wavelength (nm) | Absorptivity (%) | Fluorescence Intensity (%) | Variation (%) |
|---|---|---|---|---|---|---|---|---|---|---|---|
| Comparative Example 3 | S3 | Li2O | 0.15 | 1000 | 1 | alumina | uneven | 586 | 81.2 | 100.3 | 12 |
| Comparative Example 4 | S4 | Li2O | 0.15 | 1000 | 1 | alumina | uneven | 585 | 77.9 | 109.7 | 10 |
| Comparative Example 5 | S5 | Li2O | 0.15 | 1000 | 1 | alumina | uneven | 583 | 76.6 | 92.4 | 16 |
| Comparative Example 6 | S6 | Li2O | 0.15 | 1000 | 1 | alumina | uneven | 577 | 62.1 | 98.4 | −5 |
| Comparative Example 7 | S7 | Li2O | 0.15 | 1000 | 1 | alumina | uneven | 573 | 48.8 | 42.9 | −12 |
| Example 6 | S3 | Li2O | 0.15 | 1300 | 5 | alumina | uneven | 588 | 81.5 | 148.7 | 66 |
| Example 7 | S4 | Li2O | 0.15 | 1300 | 5 | alumina | uneven | 585 | 79.0 | 116.8 | 17 |
| Example 8 | S5 | Li2O | 0.15 | 1300 | 5 | alumina | uneven | 587 | 77.7 | 119.8 | 50 |
| Comparative Example 8 | S6 | Li2O | 0.15 | 1300 | 5 | alumina | uneven | 577 | 63.0 | 107.7 | 4 |
| Comparative Example 9 | S7 | Li2O | 0.15 | 1300 | 5 | alumina | uneven | 572 | 50.9 | 48.0 | −2 |
| Example 9 | S3 | Li2O | 0.15 | 1600 | 1 | alumina | uneven | 584 | 80.1 | 125.6 | 40 |
| Comparative Example 10 | S4 | Li2O | 0.15 | 1600 | 1 | alumina | none | 580 | 75.8 | 73.7 | −26 |
| Comparative Example 11 | S5 | Li2O | 0.15 | 1600 | 1 | alumina | none | 584 | 75.6 | 82.4 | 3 |
| Comparative Example 12 | S3 | Li2O | 0.00 | 1300 | 1 | alumina | none | 585 | 82.0 | 80.2 | −10 |
| Example 10 | S3 | Li2O | 0.03 | 1300 | 1 | alumina | uneven | 587 | 81.4 | 139.5 | 56 |
| Example 11 | S3 | Li2O | 0.75 | 1300 | 1 | alumina | uneven | 587 | 79.0 | 148.0 | 65 |
| Example 12 | S3 | Li2CO3 | 0.15 | 1400 | 1 | alumina | uneven | 586 | 83.3 | 139.2 | 55 |
| Example 13 | S3 | Li3N | 0.10 | 1400 | 1 | alumina | uneven | 587 | 83.1 | 128.1 | 43 |
| Example 14 | S3 | Li2O | 0.15 | 1400 | 1 | BN | uneven | 586 | 83.4 | 116.0 | 30 |

Change of Crystal Phase Due to Re-Diffusion of Li

With respect to the sample improved in the fluorescence intensity of Example 1, X-ray diffraction was performed to identify the phase. Also, with respect to the sample (S1) before re-diffusion of Li, the same XRD was performed to identify the phase. As a result, there was no great change in the XRD pattern related to sialon between before and after re-diffusion of Li. To be exact, the lattice constant is considered to vary with a change in the composition, but there is no marked difference in the normal XRD pattern. As a new peak, a new crystal phase derived from Li, for example, a crystal phase such as LiSi$_2$N$_3$, appears, but this was in a minute amount.

From the results of XRD, this particulate material is considered to be not Li$_2$O but sialon.

Then, topographical analysis was performed by the EDS device attached to the SEM apparatus. The results are shown in FIG. 2. Since Si and Al are measured also in the particulate material, it is confirmed that as is expected, not Li$_2$O is attached to the surface but the particulate uneven surface layer is sialon. For comparison, a portion without the particulate material was analyzed by EDS. Comparison with the results obtained revealed that oxygen is increased in the particulate uneven surface layer. The particulate material is considered to be an oxygen-rich sialon.

Figure 3:
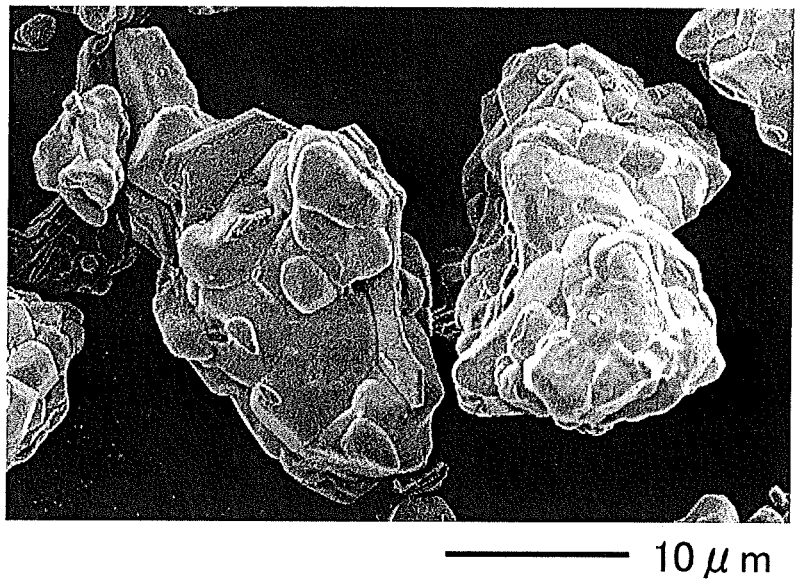
FIG. 3 is a photograph showing the particle morphology observed by SEM of the sample (particle) of Comparative Example 10 in which the fluorescence intensity is reduced by the re-diffusion of Li at 1,600° C.

Next, with respect to the sample reduced in the fluorescence intensity by the re-diffusion of Li at 1,600° C. of Comparative Example 10, the particle morphology was observed by SEM. The results are shown in FIG. 3. The particulate structure on the particle surface nearly disappeared. From comparison between Comparative Example 10 and Example 1, it is considered that when the fluorescence characteristics are improved, particulate unevenness on the particle surface emerges.

INDUSTRIAL APPLICABILITY

Industrial usefulness of the Li-containing α-sialon phosphor particle of the present invention and the lighting device and the image display device each using the same is evident.

The invention claimed is:

1. An Li-containing α-sialon phosphor particle, which is a lithium-containing α-sialon phosphor particle represented by formula (1):

$$Li_xEu_ySi_{12-(m+n)}Al_{(m+n)}O_{n+\delta}N_{16-n-\delta} \quad (1)$$

(wherein $0.4 \leq x \leq 1.5$, $0.001 \leq y \leq 0.2$, $1.0 \leq m \leq 2.8$, $0.1 \leq n+\delta \leq 3.2$, and, assuming that average valence of Eu is a, $x+ya+\delta=m$),
wherein light absorptivity in a wavelength region near 450 nm is 65% or more and said lithium-containing α-sialon phosphor particle has on a surface thereof a sialon surface layer having an uneven surface microstructure formed by particulate sialon with a dimension of 1 μm or less.

2. The particle as claimed in claim 1, wherein $0<\delta$ and $0.3 \leq x/m \leq 0.9$.

3. The particle as claimed in claim 1, wherein average particle size of said lithium-containing α-sialon phosphor particle is 0.5 to 30 μm.

4. The particle as claimed in claim 1, wherein said sialon surface layer is a lithium-containing α-sialon and a dimension of the particulate sialon in said sialon surface layer is 0.01 to 0.8 μm.

5. The particle as claimed in claim 1, wherein fluorescence having a peak wavelength of 560 to 590 nm is emitted by injecting excitation light.

6. A method for producing an Li-containing α-sialon phosphor particle comprising:
forming a mixture of a silicon nitride or nitrogen-containing silicon compound powder, an AlN-containing substance as an aluminum source, an Li source composed of a nitride, oxynitride or oxide of Li or a precursor substance capable of becoming an oxide of Li by pyrolysis, and an Eu source composed of a nitride, oxynitride or oxide of Eu or a precursor substance capable of becoming an oxide of Eu by pyrolysis,
firing the mixture at 1,500 to 1,800° C. in a nitrogen-containing inert gas atmosphere under atmospheric pressure to obtain a lithium-containing α-sialon powder as an intermediate,
adding and mixing an additional lithium source to the powder, and
re-firing an obtained mixture at a temperature lower than said firing temperature or at a temperature of 1,100° C. to less than 1,600° C. in a nitrogen-containing inert gas atmosphere under atmospheric pressure.

7. The method as claimed in claim 6, wherein said lithium-containing α-sialon phosphor particle obtained by re-firing is a lithium-containing α-sialon phosphor particle represented by formula (1):

$$Li_xEu_ySi_{12-(m+n)}Al_{(m+n)}O_{n+\delta}N_{16-n-\delta} \quad (1)$$

(wherein $0.4 \leq x \leq 1.5$, $0.001 \leq y \leq 0.2$, $1.0 \leq m \leq 2.8$, $0.1 \leq n+\delta \leq 3.2$, and assuming that an average valence of Eu is a, $x+ya+\delta=m$; and $0<\delta$ and $0.3 \leq x/m \leq 0.9$), in which light absorptivity in a wavelength region near 450 nm is 65% or more and said lithium-containing α-sialon phosphor particle has on a surface thereof a sialon surface layer having an uneven surface microstructure formed by particulate sialon with a dimension of 1 μM or less.

8. The method as claimed in claim 6, wherein said lithium-containing α-sialon phosphor particle as an intermediate is a lithium-containing α-sialon phosphor particle represented by formula (1):

$$Li_xEu_ySi_{12-(m+n)}Al_{(m+n)}O_{n+\delta}N_{16-n-\delta} \quad (1)$$

(wherein $0.3 \leq x < 1.2$, $0.001 \leq y \leq 0.2$, $1.0 \leq m \leq 2.9$, $0.1 \leq n+\delta \leq 3.2$, and, assuming that the average valence of Eu is a, $x+ya+\delta=m$) and in said lithium-containing α-sialon phosphor particle obtained by re-firing, x/m is increased by at least 0.02 compared with said lithium-containing α-sialon phosphor particle as an intermediate.

9. The method as claimed in claim 6, wherein said lithium-containing α-sialon phosphor particle as an intermediate has a light absorptivity of 65% or more in a wavelength region near 450 nm.

10. The method as claimed in claim 6, wherein an amount of said additional lithium source is, in terms of metallic Li, 0.05 to 1.6 mol per mol of said lithium-containing α-sialon powder as an intermediate.

11. The method as claimed in claim 6, wherein said Li-containing α-sialon-based phosphor particle obtained by re-firing emits fluorescence having a peak wavelength of 560 to 590 nm is emitted by injecting excitation light.

12. A lighting device comprising a light emitting source and a phosphor containing the particle claimed in claim 1.

13. The lighting device as claimed in claim 12, wherein said light emitting source is an LED which emits light having a wavelength of 330 to 500 nm.

14. The lighting device as claimed in claim 12, wherein said Li-containing α-sialon-based phosphor particle is combined with a red phosphor of 600 to 650 nm to obtain an emission color of daytime white color or daylight color.

15. An image display device comprising an excitation source and a phosphor containing the particle claimed in claim 1.

16. The image display device as claimed in claim 15, wherein said excitation source is an electron beam, an electric field, a vacuum ultraviolet or an ultraviolet ray.

* * * * *